United States Patent
Park et al.

(10) Patent No.: US 10,547,289 B2
(45) Date of Patent: Jan. 28, 2020

(54) HIGH ORDER MILLER N-PATH FILTER

(71) Applicant: QUALCOMM Incorporated, San Diego, CA (US)

(72) Inventors: Joung Won Park, San Diego, CA (US); Li-chung Chang, Irvine, CA (US); Faramarz Sabouri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/963,056

(22) Filed: Apr. 25, 2018

(65) Prior Publication Data

US 2019/0334504 A1    Oct. 31, 2019

(51) Int. Cl.
| | | |
|---|---|---|
| *H03H 11/04* | (2006.01) | |
| *H03F 3/19* | (2006.01) | |
| *H03F 3/21* | (2006.01) | |
| *H04B 1/16* | (2006.01) | |

(52) U.S. Cl.
CPC .............. *H03H 11/04* (2013.01); *H03F 3/19* (2013.01); *H03F 3/21* (2013.01); *H04B 1/16* (2013.01); *H03F 2200/168* (2013.01); *H03F 2200/294* (2013.01); *H03F 2200/336* (2013.01); *H03F 2200/451* (2013.01)

(58) Field of Classification Search
CPC .. H03H 11/04; H04B 1/16; H03F 3/19; H03F 3/21; H03F 2200/294; H03F 2200/336; H03F 2200/168; H03F 2200/451
See application file for complete search history.

(56) References Cited

U.S. PATENT DOCUMENTS

| | | | |
|---|---|---|---|
| 9,374,063 B1 * | 6/2016 | Mak ..................... | H03H 19/004 |
| 9,484,867 B2 | 11/2016 | Arcudia et al. | |
| 2010/0214024 A1 * | 8/2010 | Jones .................... | H03F 1/0205 |
| | | | 330/310 |
| 2016/0336910 A1 * | 11/2016 | Miri Lavasani ......... | H03F 3/19 |
| 2017/0104338 A1 | 4/2017 | Hopperdietzel | |
| 2017/0201280 A1 * | 7/2017 | Hedayati ................... | H03F 1/08 |
| 2017/0214391 A1 | 7/2017 | Hedayati et al. | |
| 2017/0222628 A1 * | 8/2017 | Darvishi ............... | H03H 19/002 |
| 2018/0048293 A1 * | 2/2018 | Gathman ............. | H03H 11/126 |
| 2018/0054171 A1 * | 2/2018 | Pehlivanoglu ........ | H03F 1/0266 |
| 2019/0165752 A1 * | 5/2019 | Ta ........................ | H03H 7/0115 |

FOREIGN PATENT DOCUMENTS

CN    106533387 A    3/2017

OTHER PUBLICATIONS

Park J.W., et al., "Channel Selection at RF Using Miller Bandpass Filters", IEEE Journal of Solid-State Circuits, vol. 49, No. 12, Dec. 2014, pp. 3063-3078.

* cited by examiner

*Primary Examiner* — Kenneth T Lam
(74) *Attorney, Agent, or Firm* — Seyfarth Shaw LLP

(57) ABSTRACT

An N-path filter with one or more branches selectively coupled to a shared circuit node includes a first branch having a first feedback path and a second feedback path. The first feedback path includes a Miller amplifier having an input coupled to an input voltage and a first capacitor coupled to both the input voltage and an output of the Miller amplifier. The second feedback path includes a node in common with the first feedback path. The second feedback path also includes a first high pass filter coupled to the output of the Miller amplifier and a second capacitor coupled to both the first capacitor and the first high pass filter.

19 Claims, 15 Drawing Sheets

HIGH ORDER MILLER N-PATH FILTER

TECHNICAL FIELD

The present disclosure generally relates to wireless receivers. More specifically, the present disclosure relates to an application of Miller effect on N-path filters configured as bandpass filters to achieve a high order Miller N-path filter.

BACKGROUND

Advances in technology have resulted in smaller and more powerful computing devices. For example, there currently exist a variety of portable personal computing devices or user equipments (UEs), including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks.

In some types of wireless networks, the UE communicates with one or more network base stations. In some scenarios, different base stations may use different radio access technologies (RATs). The term RAT refers to the physical connection for a radio-based communication network. Examples of different RATs include, without limitation, third generation partnership project (3GPP) technologies (e.g., third generation technology (3G), fourth generation technology (4G), and fifth generation technology (5G)), millimeter wave (mmW) technology (extremely high frequency (EHF)), Bluetooth technology, and Wi-Fi technology. In a millimeter wave (mmW) system, multiple antennas are used for beamforming (e.g., in the range of 30 gigahertz (GHz), 60 GHz, etc.)

The different RATs may have different capabilities. For example, the UE may have the capability to access both a long term evolution (LTE) network and a millimeter wavelength (mmW) network. The downlink/uplink (DL/UL) access link between an LTE base station and the UE is generally more reliable than the access link between an mmW base station and the UE. However, the LTE link generally has lower capacity than the mmW link.

In UEs that can simultaneously transmit and receive wireless communications in accordance with the wireless network, transmit (TX) leakage can impose a performance limitation on receive (RX) circuitry. TX leakage and other jammers in the RX circuitry can be modulated and down-converted to baseband along with a received wireless signal. TX leakage and jammers may have a relatively large voltage swing compared to the received signal and may saturate an output of a receiver that converts the received signal from radio frequency (RF) to baseband.

In carrier aggregation (CA) architectures, blockers (TX leakage and jammers) are a performance limitation of RX circuitry. For intra-CA operation where a low noise amplifier (LNA) is followed by a cascode device or a transconductance stage, the LNA output is a high impedance node. The high impedance causes large blocker swing and linearity issues. For concurrent CA operation, the noise figure in one CA receive path may be degraded if a signal in another CA receive path is larger and acts as a jammer.

SUMMARY

An N-path filter with one or more branches selectively coupled to a shared circuit node includes a first branch having a first feedback path and a second feedback path. The first feedback path includes an amplifier (e.g., a Miller amplifier or an amplifier based on Miller effect) having an input coupled to an input voltage and a first capacitor coupled to both the input voltage and an output of the Miller amplifier. The second feedback path includes a node in common with the first feedback path. The second feedback path also includes a first high pass filter coupled to the output of the Miller amplifier and a second capacitor coupled to both the first capacitor and the first high pass filter.

An N-path filter with one or more branches selectively coupled to a shared circuit node includes a first branch having a first feedback path and a second feedback path. The first feedback path includes a Miller amplifier having an input coupled to an input voltage and first means for generating an impedance coupled to both the input voltage and an output of the Miller amplifier. The second feedback path includes a node in common with the first feedback path. The second feedback path also includes a first high pass filter coupled to the output of the Miller amplifier and second means for generating an impedance coupled to both the first impedance generating means and the first high pass filter.

A method for filtering a wireless signal at a receiver includes receiving a radio frequency signal at a shared circuit node selectively coupled to each of multiple branches of an N-path filter. Each branch of the N-path filter includes a first feedback path including a Miller amplifier and a second feedback path having a node in common with the first feedback path. The method also includes generating a high impedance at the common node to prevent the radio frequency signal from traversing the first feedback path and the second feedback path when the radio frequency signal is received at a first frequency. The method further includes generating a low impedance at the common node to allow the radio frequency signal to traverse the first feedback path and/or the second feedback path when the radio frequency signal is received at a second frequency. The second frequency is higher than the first frequency.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
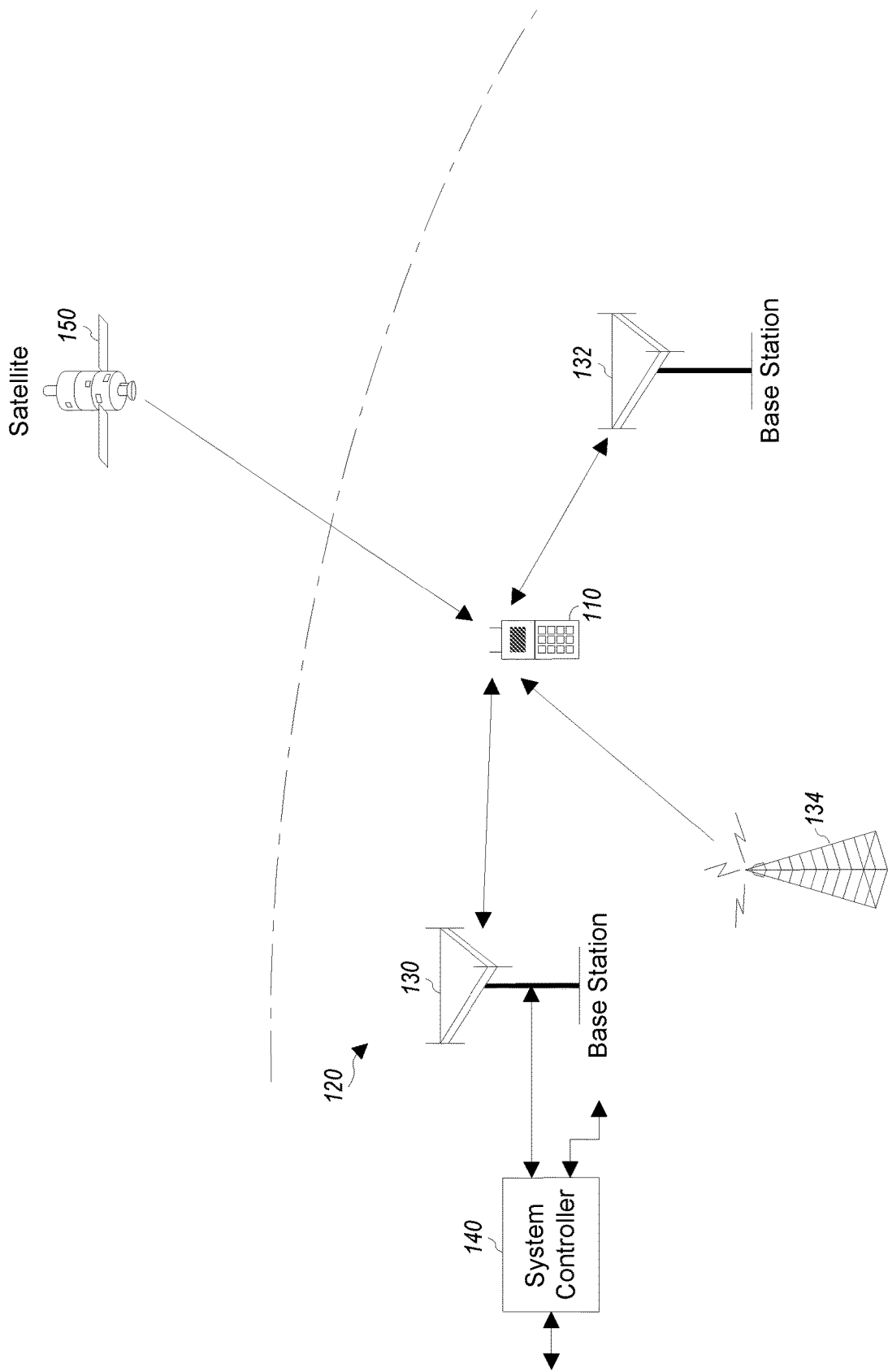
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

In user equipments (UEs) that can simultaneously transmit and receive wireless signals in accordance with the wireless network, transmit (TX) leakage can impose a performance limitation on receive (RX) circuitry. TX leakage and other jammers (or jammer signals) in the RX circuitry can be modulated and down-converted to baseband along with a received wireless signal. TX leakage and jammers may have a relatively large voltage swing compared to the received signal and may saturate an output of a receiver that converts the received signal from radio frequency (RF) to baseband.

In carrier aggregation (CA) architectures, blockers (transmit (TX) leakage and jammers) are a performance limitation of RX circuitry. TX leakage is the leakage from a TX chain (e.g., a transmit path including a transmitter) into a receive (RX) chain (e.g., a receive path including a receiver) in a transceiver or transceiver front end. Signals at a local oscillator (LO) frequency and multiples thereof (e.g., two and three times the LO frequency) coupling into the RX chain together with the TX leakage can be modulated and down-converted to the baseband (BB). Large voltage swings can saturate the BB output. This may be mitigated by decreasing the BB gain, although this may degrade the signal-to-noise ratio (SNR).

In non-CA applications, TX leakage or blockers and jammers are limiting factors to improving noise figure (NF) and linearity. Large blockers and TX leakage may prevent employing some of the architectures that are well-suited to achieving the increased NF. For example, the TX jammers cause TX second order intercept point (IIP2) problems and limits signal-to-noise distortion ratio (SNDR) performance of a receiver.

Thus, circuits used to reject TX leakage or blockers to maintain sensitivity during concurrent CA or non-CA operation are important. Some techniques for reducing the effect of the jammer include a large TX capacitor used in front of a transimpedance amplifier (TIA) to absorb a TX jammer current. This method, however, specifies a large TX capacitor to sink a current of the transmit jammer into the TX capacitor to reduce a voltage swing (as the voltage swing is inversely proportional to the capacitance of the TX capacitor). In addition, if the TX jammer is too close to in-band, the amount of the TX rejection is small, which causes a lower gain mode to be specified, degrading noise figure (NF). This small amount of TX rejection holds true even when the large TX capacitor is used. Therefore, an optimum signal-to-noise ratio cannot be achieved with the circuit.

Moreover, the bandwidth of desired signals is becoming larger and larger (e.g., on the order of 80 MHz). Therefore, it is becoming increasingly challenging to implement a high quality factor (high-Q) bandpass filter at radio frequencies to reject out-of-band jammers and TX leakage while avoiding attenuation of desired signals in the RX band.

N-path filters may be used to provide high-Q bandpass filters at radio frequencies. An N-path filter may include N-branches. For example, the N-path filter may be composed of N identical linear time invariant (LTI) networks and 2N frequency mixers driven by time/phase-shifted versions of a clock signal. If the LTI networks exhibit a low-pass characteristic around direct current (DC), mixing by the mixers results in a bandpass filter response with a passband centered around the mixing frequency. That is, the input signal is down-converted to baseband, filtered by the LTI network, and then up-converted again to the original band of the input signal. The center frequency is determined by the mixing frequency and is insensitive to filter component values. A high mixing frequency combined with a narrow low-pass filter bandwidth provides a very high-Q filter.

Some techniques use Miller effect to reduce the size of the capacitor used in an N-path filter to improve performance of the RX circuitry. For example, amplification (using a Miller amplifier) may be applied to increase a voltage swing across the capacitor. Accordingly, the size of the capacitor used for the N-path filter is reduced. However, these techniques may not achieve high-order filtering while applying the Miller effect to the capacitor. It is therefore desirable to design a high-order high-Q bandpass filter to mitigate these issues.

Aspects of the present disclosure include an N-path filter with one or more branches selectively coupled to a shared circuit node. The N-path filter is coupled to a low noise amplifier (LNA). For example, the N-path filter may be coupled to an input of the LNA, an output of the LNA or between two LNAs of the receiver. The N-path filter may be configured as a bandpass filter. Each branch includes a first feedback path and a second feedback path (or high pass filtering path). When the one or more branches include multiple branches, each of the multiple branches may be selectively coupled with a shared circuit node. A synthesized impedance may be achieved by coupling the multiple branches in parallel.

In one aspect of the present disclosure, the first feedback path of the first branch of the N-path filter includes an amplifier (e.g., a Miller amplifier or an amplifier based on Miller effect) and a first capacitor. The Miller amplifier includes a first terminal (e.g., an input) coupled to an input voltage. The first terminal may correspond to the shared circuit node. For example, the N-path filter may be connected or coupled to a circuit (e.g., a Thévenin equivalent circuit) that includes an input signal from a voltage source Vin through an input impedance (e.g., a series resistance). The Thévenin equivalent circuit may represent an equivalent of a signal received by an antenna and amplified by the LNA. The voltage source Vin may be deemed the input voltage.

The first capacitor is coupled to both the input voltage and a second terminal (e.g., an output) of the Miller amplifier. For example, the input of the Miller amplifier is coupled to the shared circuit node, which is coupled to the voltage source or input voltage Vin. In one aspect of the disclosure, the first capacitor is coupled to the input voltage through a first switch or transistor and coupled to the output of the Miller amplifier through a second transistor.

The second feedback path has a first node in common with the first feedback path. The second feedback path includes a first high pass filter and a second capacitor. The first node in common with the first feedback path merges the second feedback path to the first feedback path. For example, the second capacitor is coupled to the input of the Miller amplifier via the first transistor. The first high pass filter is coupled to the output of the Miller amplifier. For example, the first high pass filter may be coupled to the output of the Miller amplifier via the second transistor.

In one aspect of the disclosure, the second feedback path may further include a first buffer. The first buffer may be positioned between the first high pass filter and the second capacitor. The first buffer may be implemented in accordance with a biased source follower configuration.

In some aspects of the disclosure, the N-path filter may include a third feedback path and a third capacitor. The third feedback path may be merged with the second feedback path. The third feedback path includes a second high pass filter coupled to an output of the first high pass filter. The third capacitor may be coupled to both the first capacitor and the second capacitor as well as the second high pass filter. The first buffer is also coupled between an output of the first high pass filter and an input of the second high pass filter. The N-path filter may be integrated into a receive (RX) chain before or after a low noise amplifier (LNA) in accordance with a shunt configuration.

Figure 13:
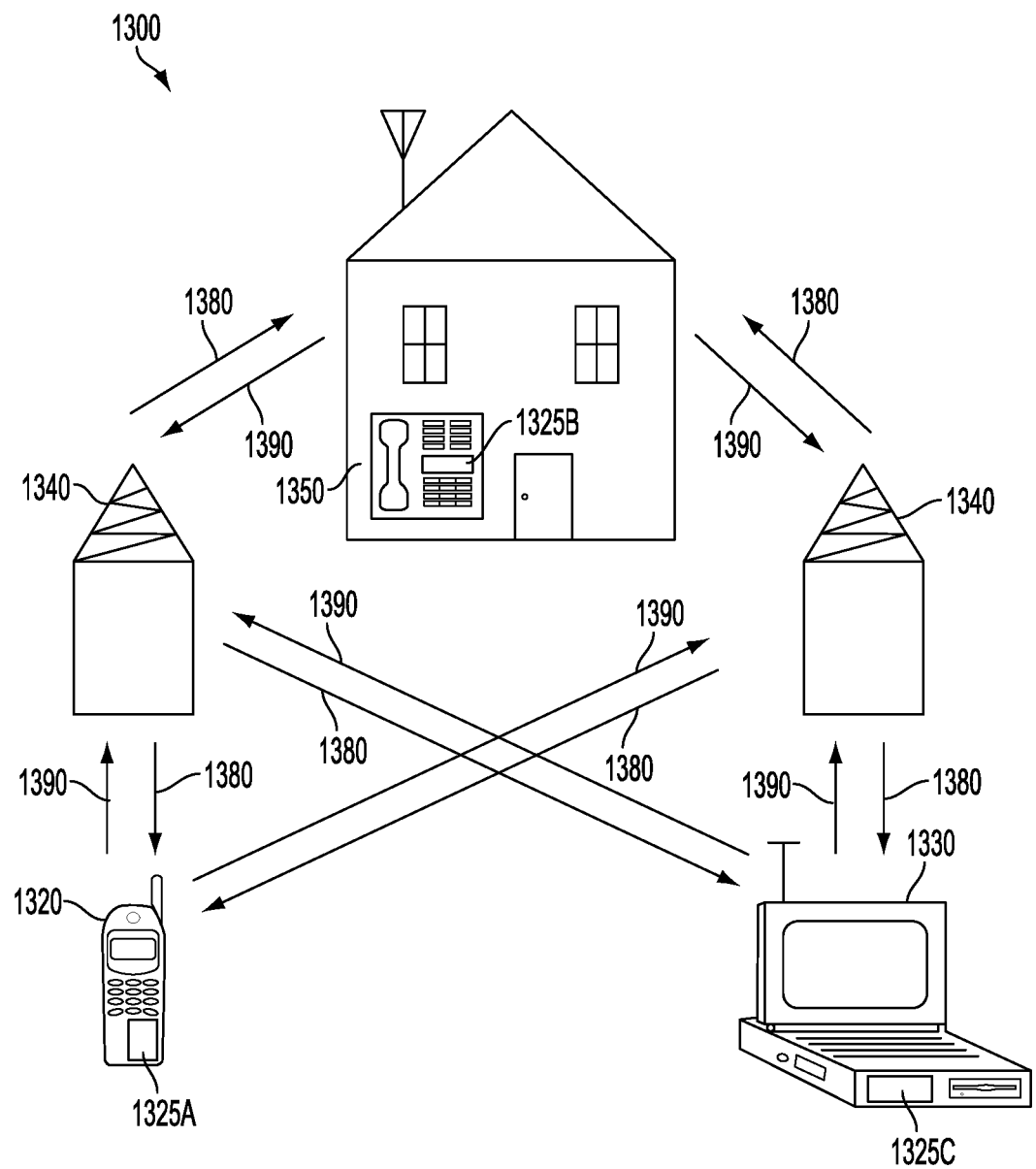
FIG. 13 is a block diagram showing an exemplary wireless communication system in which a configuration of the disclosure may be advantageously employed.

The aspects of the present disclosure may be implemented in the system of FIG. 1 and the system of FIG. 13. More specifically, aspects of the present disclosure may be implemented in the wireless device 200 of FIG. 2.

FIG. 1 shows a wireless device 110, which may include the disclosed N-path filter, communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

Figure 2:
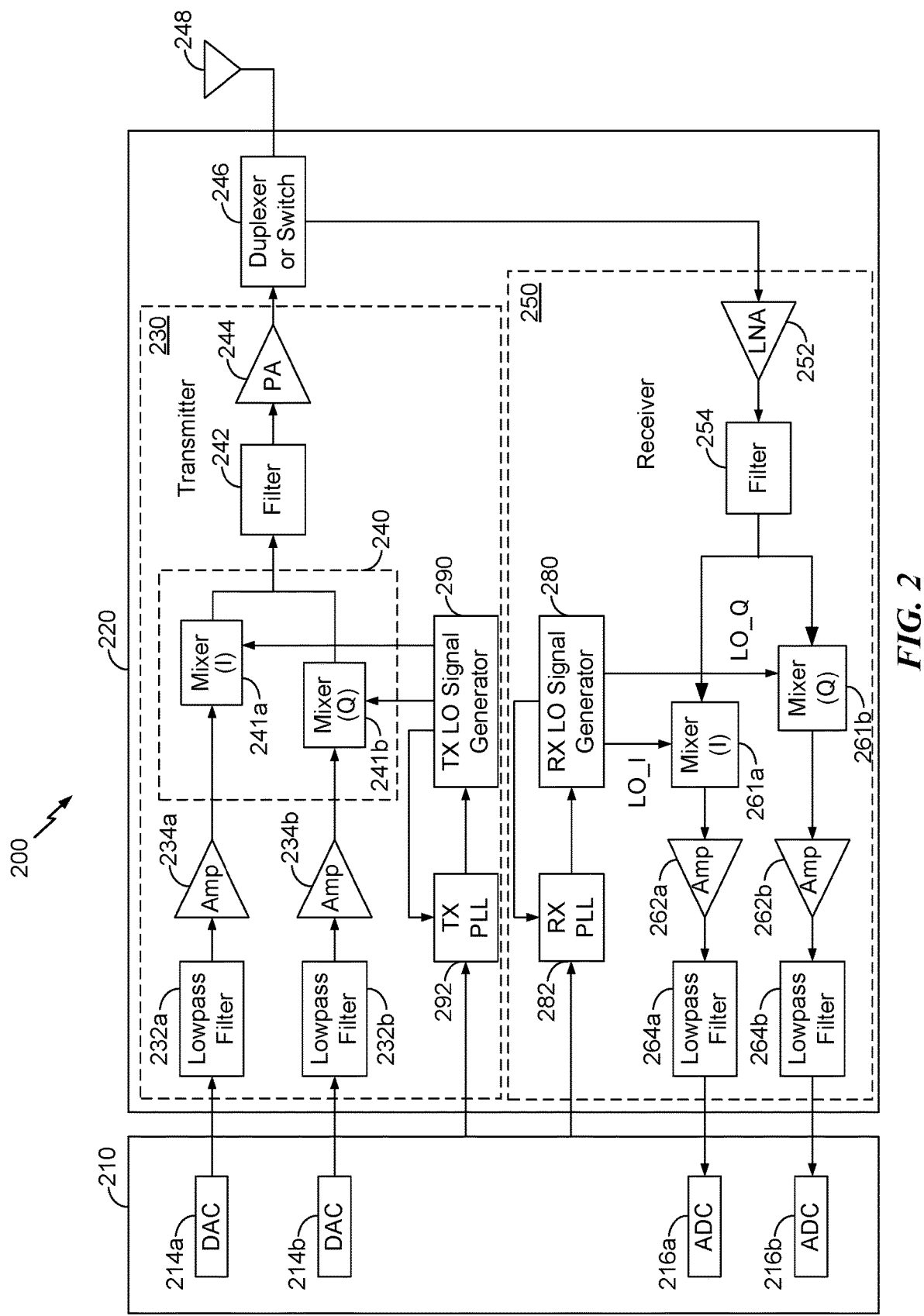
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), up-converters, down-converters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An up-converter 240 including upconversion mixers 241a and 241b up-converts the in-phase (I) and quadrature (Q) baseband signals with in-phase (I) and quadrature (Q) transmit (TX) local oscillator (LO) signals from a TX LO signal generator 290 to provide an up-converted signal. A filter 242 filters the up-converted signal to reduce undesired images caused by the frequency up-conversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication or wireless signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Down-conversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency down-conversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

The wireless device 300 may support carrier aggregation, which is operation on multiple carriers. Carrier aggregation may also be referred to as multi-carrier operation.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 3A:
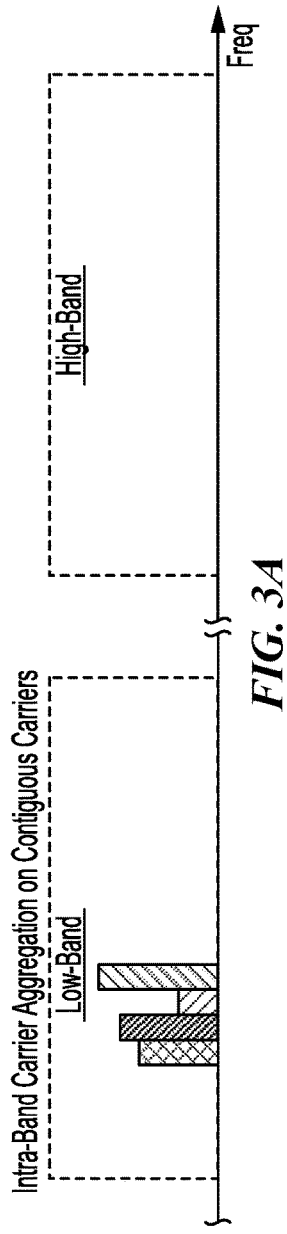
FIGS. 3A-3D show four examples of carrier aggregation (CA).

FIG. 3A shows an example of contiguous intra-band CA. In the example shown in FIG. 3A, a wireless device (e.g., the wireless device 110) is configured with four contiguous carriers in the same band, which is a band in low-band. The wireless device may send and/or receive transmissions on multiple contiguous carriers within the same band.

Figure 3B:
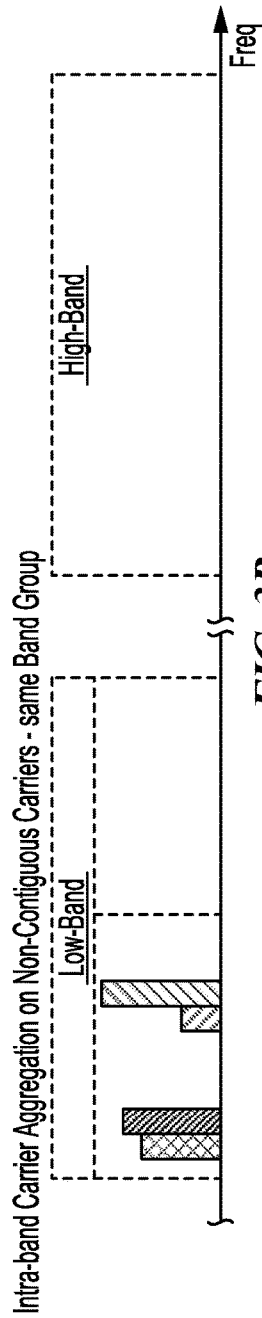

FIG. 3B shows an example of non-contiguous intra-band CA. In the example shown in FIG. 3B, a wireless device (e.g., the wireless device 110) is configured with four non-contiguous carriers in the same band, which is a band in low-band. The carriers may be separated by 5 MHz, 10 MHz, or some other amount. The wireless device may send and/or receive transmissions on multiple non-contiguous carriers within the same band.

Figure 3C:
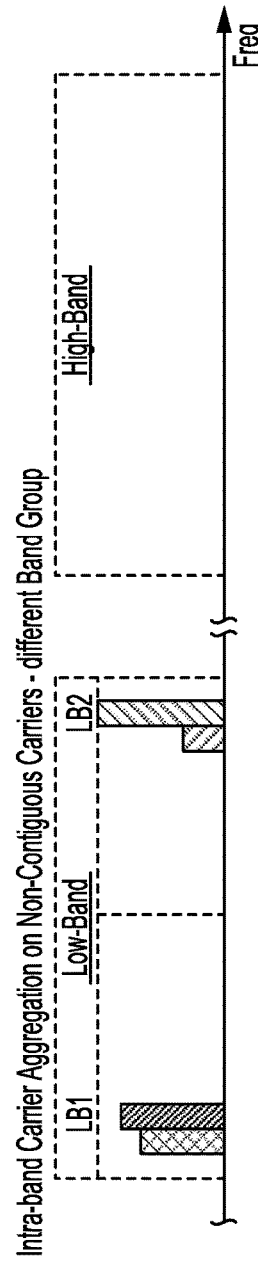

FIG. 3C shows an example of inter-band CA in the same band group. In the example shown in FIG. 3C, a wireless device (e.g., the wireless device 110) is configured with four carriers in two bands in the same band group, which is low-band. The wireless device may send and/or receive transmissions on multiple carriers in different bands in the same band group (e.g., low-Band 1 (LB1) and low-Band 2 (LB2) in FIG. 3C).

Figure 3D:
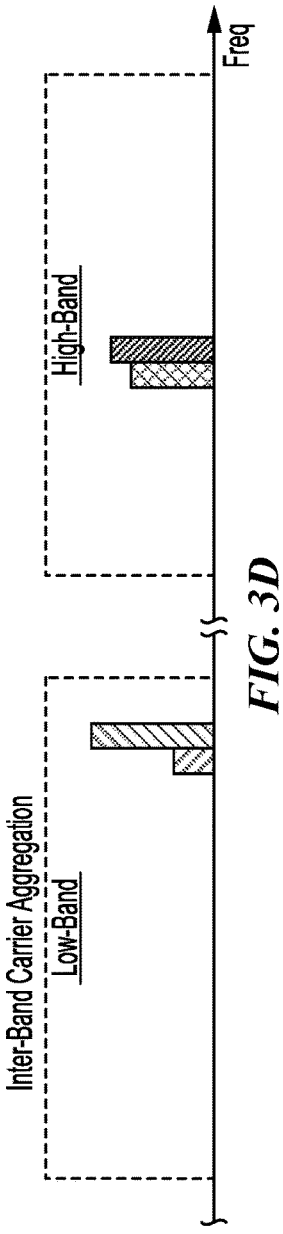

FIG. 3D shows an example of inter-band CA in different band groups. In the example shown in FIG. 3D, a wireless device (e.g., the wireless device 110) is configured with four carriers in two bands in different band groups, which include two carriers in one band in low-band and two additional carriers in another band in high-band. The wireless device may send and/or receive transmissions on multiple carriers in different bands in different band groups (e.g., low-band and high-band in FIG. 3D). FIGS. 3A to 3D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long term evolution in unlicensed spectrum (LTE-U).

Figure 4A:
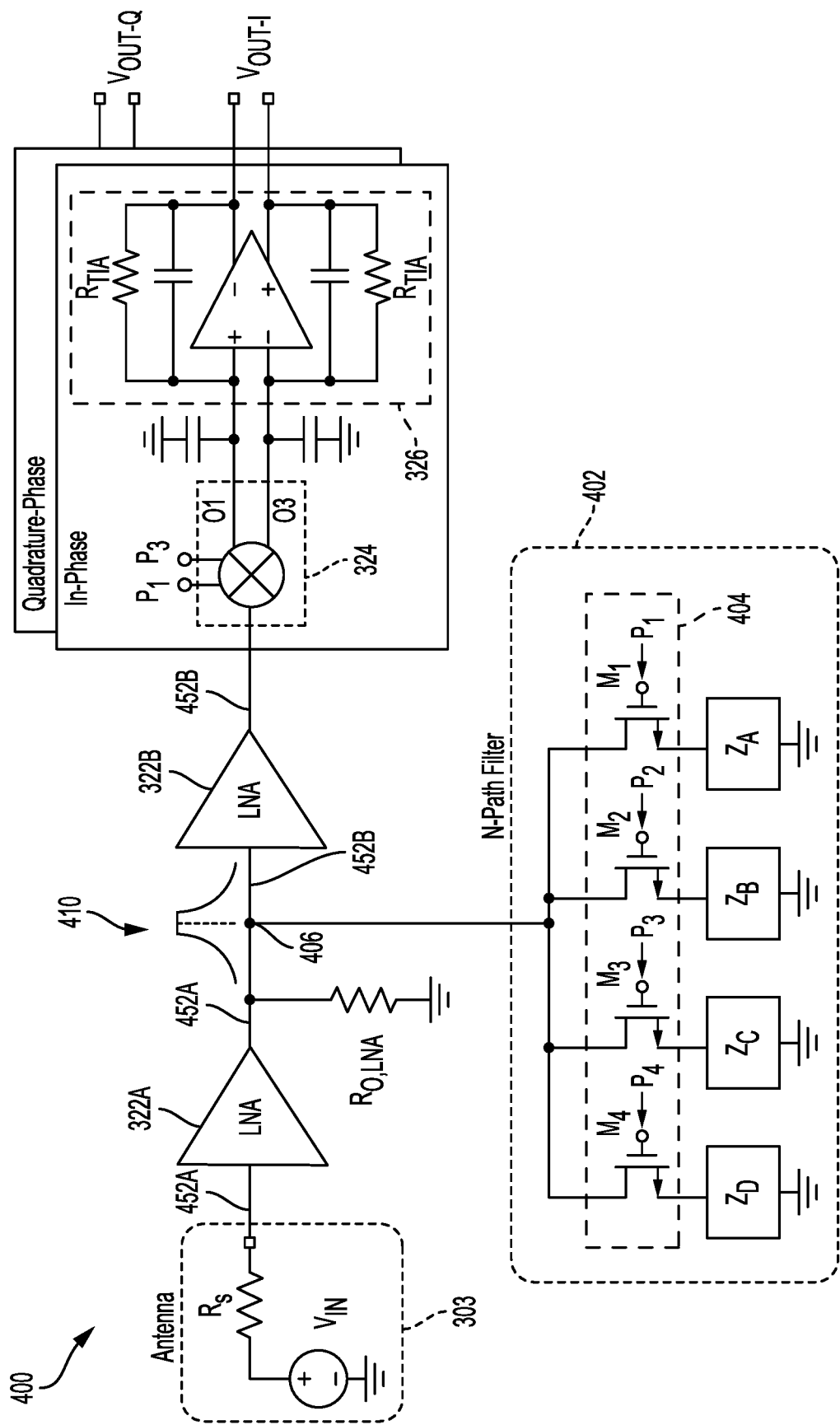
FIG. 4A illustrates an example receive chain of a radio frequency (RF) front end including an N-path filter, in accordance with certain aspects of the present disclosure.

FIG. 4A illustrates an example receive chain (e.g., including the receiver 250) of an RF front end comprising an N-path filter 402, in accordance with certain aspects of the present disclosure. In certain aspects, the LNA 252 of FIG. 2 may include two separate LNAs (e.g., a first LNA 452A and a second LNA 452B). For certain aspects, the first LNA 452A may be external to an RF integrated circuit (RFIC), while the second LNA 452B may be included in the RFIC, along with other circuits (e.g., the mixers 261a and 261b as well as the lowpass filters 264a and 264b). The lowpass filters 264a and 264b may be baseband filters (BBF). For other aspects, the first LNA 452A and the second LNA 452B may both be included in the RFIC, along with the other circuits. The N-path filter 402 may be connected with a node 406 between the LNAs 452A and 452B. In this manner, the N-path filter 402 may function as a shunt filter having a frequency response 410 in an effort to pass signals in a desired receive (RX) band and reject signals having frequencies outside this band (including TX leakage and jammers).

The N-path filter 402 has a number N=4 of parallel branches selectively connected with the node 406, which is a common node for the branches. Those having ordinary skill in the art of N-path filters understand that there may be more or less than N=4 branches in any of the various aspects of the present disclosure.

The N-path filter 402 may include a number of switches 404 (e.g., N switches, one in each filter branch), which may be implemented with n-channel metal oxide semiconductor (NMOS) transistors, individually labeled as transistors M1, M2, M3, and M4 in FIG. 4A. For other aspects, the switches 404 in the N-path filter may be implemented with p-channel metal-oxide-semiconductor (PMOS) transistors or a combination of PMOS and NMOS transistors.

Figure 4B:
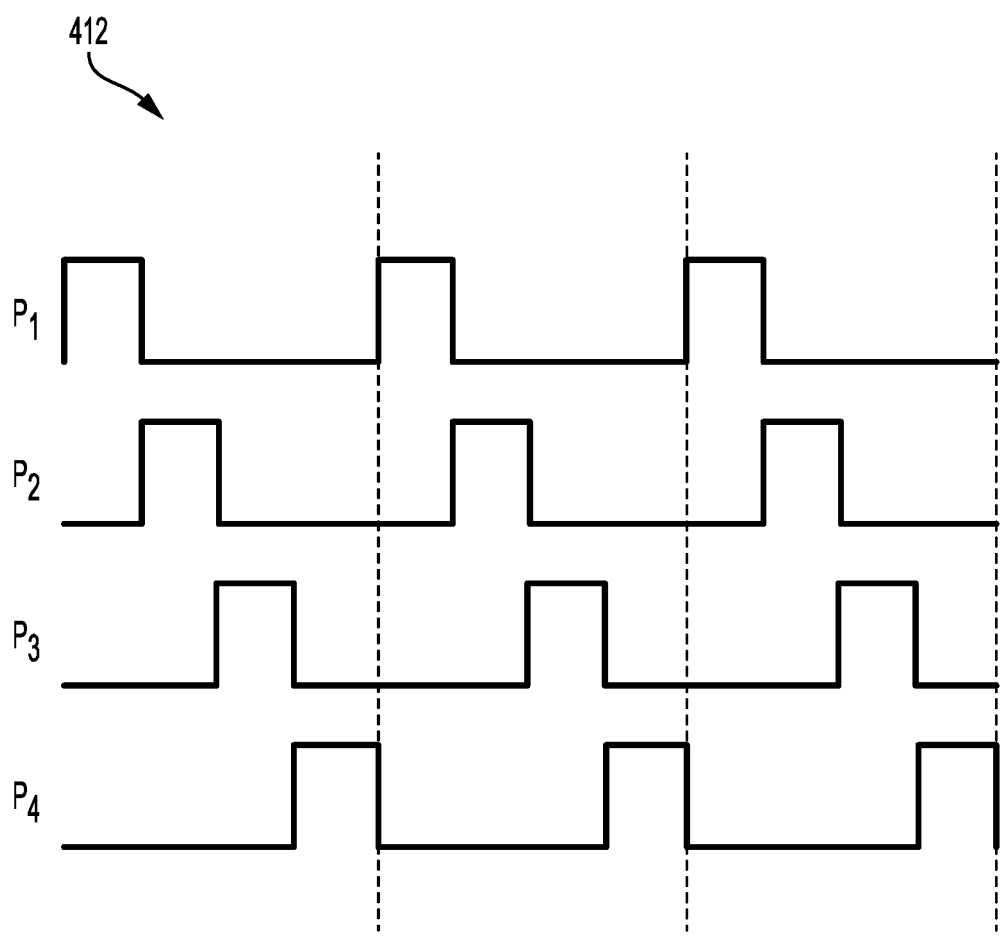
FIG. 4B is an example timing diagram illustrating signals used to control switching operations of transistors in the N-path filter of FIG. 4A, in accordance with certain aspects of the present disclosure.

The four transistors M1, M2, M3, and M4 may be controlled using four 25% duty cycle signals P1, P2, P3, and P4, respectively, as illustrated in the timing diagram 412 of FIG. 4B. In this manner, one switch 404 may be opened before or as the next switch in the control signal sequence is closed. That is, each of the transistors M1, M2, M3, and M4 may be driven such that the transistors are activated in sequence and periods during which each transistor is activated (e.g., each switch 404 is closed) ideally do not overlap, although a small amount of overlap may be tolerated for practical implementations. The duty cycle of the control signals may be a function of the number N of filter branches (e.g., equal to 1/N). The amount of overlap, if any, in the control signals P1, P2, P3, etc. may be a small fraction (e.g., 1/10th) of the duty cycle.

Each switch 404 may connect a corresponding impedance ZA, ZB, ZC, or ZD with the node 406 when closed. Impedances ZA, ZB, ZC, and ZD may all have the same impedance value. One end of each impedance ZA, ZB, ZC, or ZD may be connected with a corresponding switch 404, and the other end of each impedance may be connected with a reference potential (e.g., electrical ground, a power supply voltage, or a bias voltage) for the N-path filter 402.

In this configuration, the frequency response 410 of the N-path filter 402 may have a center frequency approximately equal to the switching frequency of the control signals P1, P2, P3, and P4 for the transistors M1, M2, M3, and M4, respectively. For example, the switching frequency may be considered as the inverse of the period between rising edges of the control signal P1, shown by vertical dashed lines in timing diagram 412. The control signals P1, P2, P3, and P4 may have the same frequency (e.g., the switching frequency), but different phases. Moreover, the bandwidth of the frequency response 410 may be twice the bandwidth of a pole of the branch impedance (ZA ZB, ZC, or ZD).

Figure 5A:
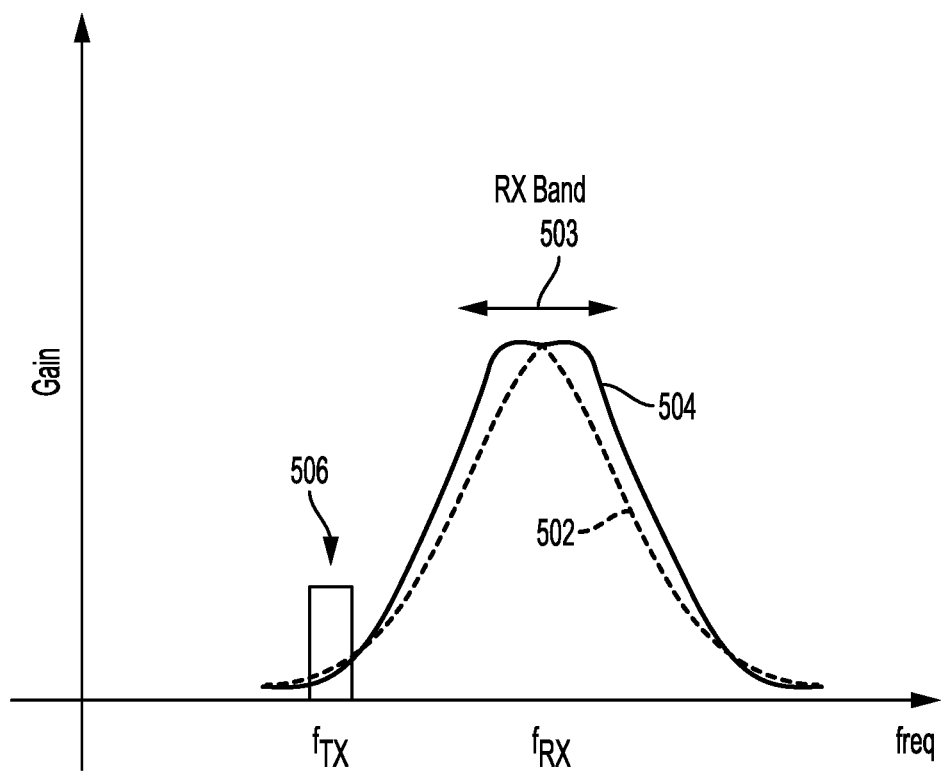
FIG. 5A illustrates an example frequency response of an N-path filter, in accordance with certain aspects of the present disclosure.

FIG. 5A illustrates example frequency responses of N-path filters. A frequency response 502 may correspond to an N-path filter configured such that each of the branch impedances (e.g., ZA, ZB, ZC, and ZD) have only one pole (e.g., implemented with a resistor-capacitor (RC) load). An N-path filter with only one pole may provide a narrow-band, high-Q bandpass filter, but when used as a filter for a wide RX band 503, it may not provide sufficient out-of-band rejection. Aspects of the present disclosure provide an N-path filter having a wideband frequency response 504. For example, an N-path filter in accordance with the present disclosure may provide similar rejection at the TX leakage frequency (fTx) 506 as a narrow-band N-path filter, but with a wide, flat passband shape.

Figure 5B:
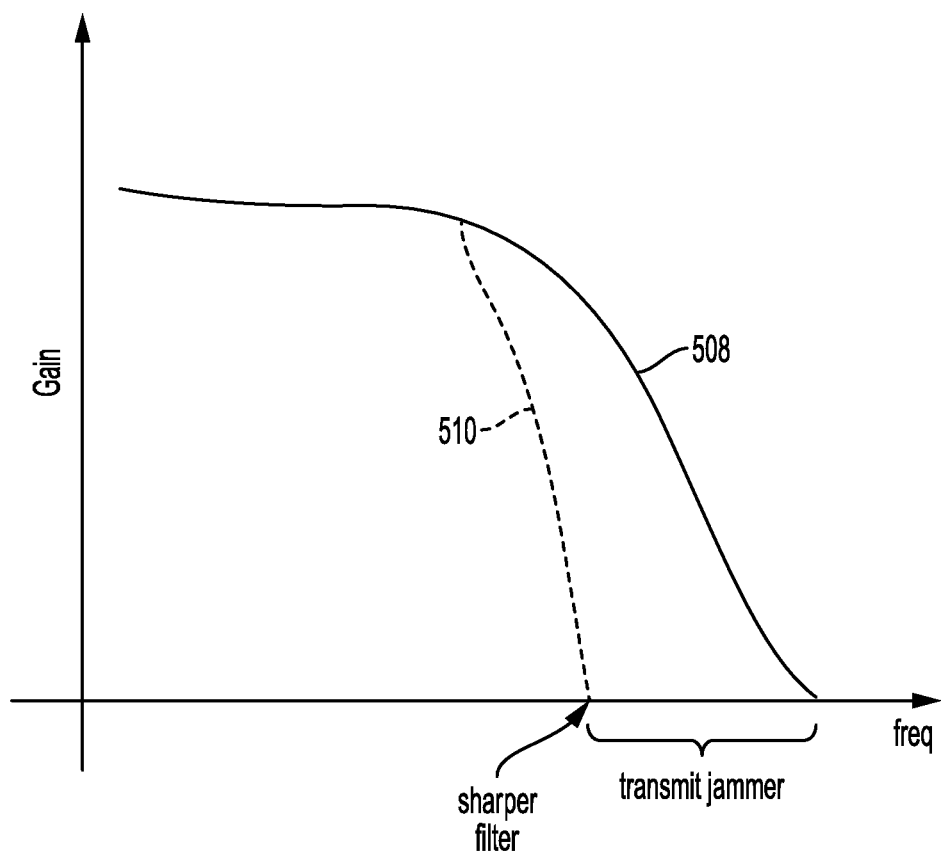
FIG. 5B illustrates an example frequency response of an N-path filter according to aspects of the present disclosure.

FIG. 5B illustrates an example frequency response of an N-path filter according to aspects of the present disclosure. A frequency response 508 may correspond to an N-path filter configured without a frequency dependent capacitor, a high pass filter, and/or a buffer. The frequency response 508 includes transmit jammers that degrade the quality of the received radio frequency signal. A frequency response 510 corresponds to an N-path filter configured with a frequency dependent capacitor, a high pass filter, and/or a buffer. The frequency dependent capacitor, the high pass filter, and the buffer may be implemented in a feedback path to provide a high pass feedback to create a sharper frequency response or sharper filter. The sharper frequency response 510 eliminates the transmit jammer.

Figure 6:
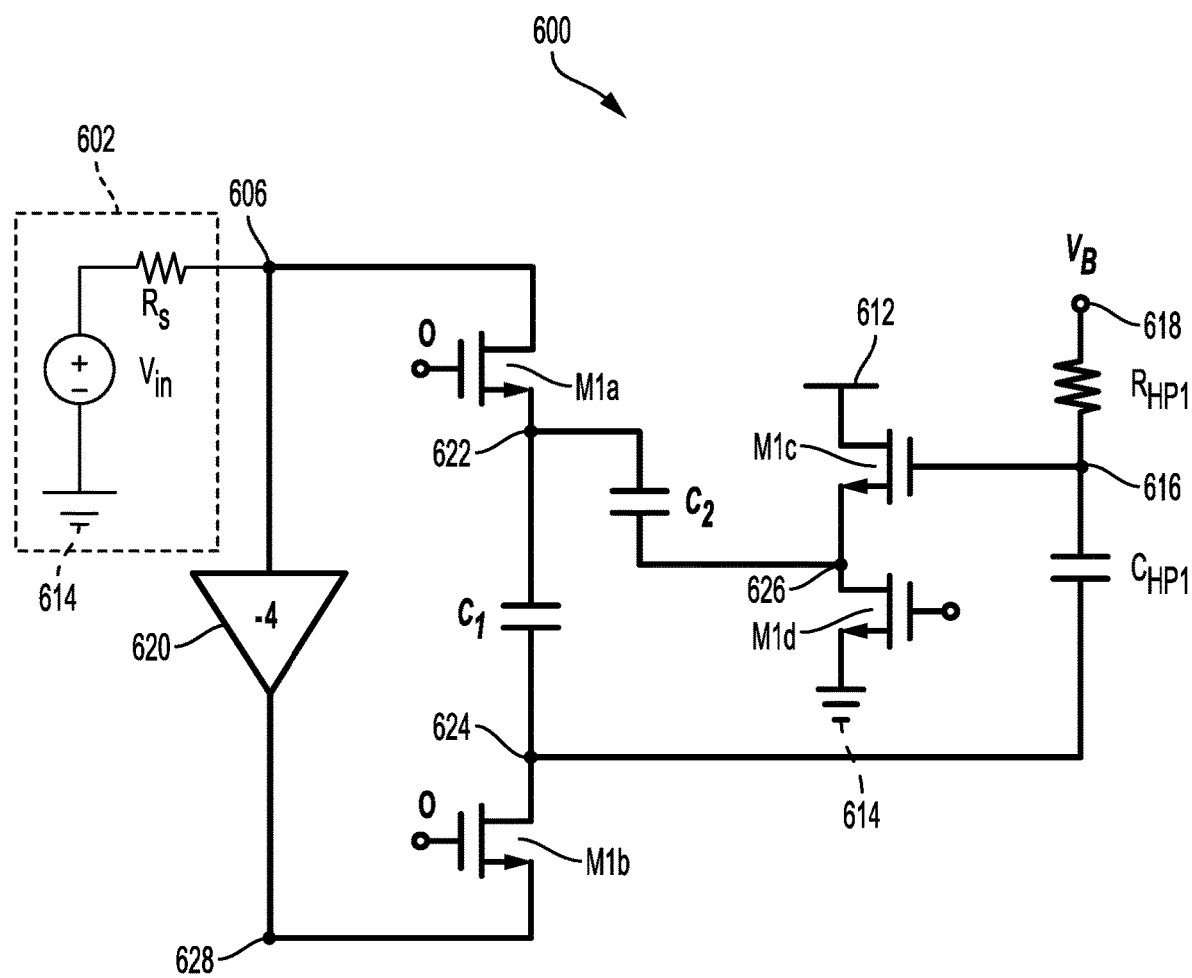
FIG. 6 illustrates an N-path filter including a single high pass filtering path according to aspects of the present disclosure.

Some N-path filters may only include switches and capacitors. For example, the N-path filter may only include switches such as M1a and M1b (as shown in FIG. 6) and a capacitor C1 (as shown in FIG. 6). However, such N-path filters may not achieve flat frequency response or wider bandwidth in-band and high rejection of a transmit frequency or a transmit jammer. Accordingly, aspects of the present disclosure include additional circuitry to achieve flat frequency response or wider bandwidth in-band and high rejection of the transmit jammer FIG. 6 illustrates an N-path filter 600 including a single high pass filtering path according to aspects of the present disclosure. For illustrative purpose, only a single branch of the N-path filter 600 is shown. The N-path filter 600, however, may include multiple branches operating in accordance with different phases (e.g., zero degrees, ninety degrees, one hundred and eighty degrees, two hundred and seventy degrees, etc.) For example, the N-path filter 600 includes a single branch (at a phase of zero degrees) that may be used to provide an impedance (e.g., $Z_A$, $Z_B$, $Z_C$, or $Z_D$) of the N-path filter 600. As illustrated, the N-path filter 600 includes a first transistor M1a, a second transistor M1b, a third transistor M1c, a fourth transistor M1d, a first capacitor C1, a second capacitor C2, a first high pass capacitor CHP1, and a first resistor RHP1.

The N-path filter 600 is illustrated as being connected with a Thévenin equivalent circuit 602 (via the node 606) having an input signal (e.g., voltage source Vin) and an input impedance (e.g., series resistance RS), which may represent the equivalent of the signal received by an antenna (e.g., the antenna 248) and amplified by an LNA (e.g., the first LNA 452A). In some aspects, the node 606 may be between two LNAs of a receiver (e.g., between the LNAs 452A and 452B), prior to an LNA of the receiver (e.g., prior to the LNA 452A) or after the LNA(s) of the receiver (e.g., after the LNA 452B). Alternatively, the node 606 may be coupled to a mixer (e.g., the mixer 261a or the mixer 261b).

The first transistor M1a, the second transistor M1b, and the first capacitor C1 are connected in series with a Miller amplifier 620 to form a first feedback path. A second feedback path (or high pass filtering path) of the first branch includes the third transistor M1c, the fourth transistor M1d, the second capacitor C2, the first high pass capacitor CHP1, and the first resistor RHP1. The first high pass capacitor CHP1 and the first resistor RHP1 form a high pass filter. In this case, the high pass filtering path includes only one zero (e.g., a zero at 5.3 MHz). The third transistor M1c and the fourth transistor M1d form a buffer coupled to the high pass filter. In one aspect of the disclosure, the buffer is a source follower (e.g., a voltage buffer or biased source follower device). The source follower isolates the second capacitor C2 from the first high capacitor CHP1 and the first resistor RHP1. Otherwise, the second capacitor C2 may alter the high-pass filter characteristics, which makes it difficult to program the zero frequency.

The second feedback path is merged with the first feedback path such that a current at a common node (e.g., node(s) 622 and/or 624) is shared between the first feedback path and the second feedback path. For example, the second feedback path is coupled to the first feedback path via nodes 622 and 624. The node 622 is at a source (or drain) of the first transistor M1a and the node 624 is at a drain (or source) of the second transistor M1b. The second capacitor C2 is coupled between the node 622 and a node 626 while the first capacitor C1 is coupled between the node 622 and the node 624. The first high pass capacitor CHP1 is between a node 616 and the node 624. The node 606 is coupled to the first terminal (e.g., an input) of the Miller amplifier 620 and to a drain (or source) of the first transistor M1a. A source (or drain) of the second transistor M1b is coupled to a second terminal (e.g., an output) of the Miller amplifier 620.

The voltage at node 624 passes through the high-pass filter created by the first resistor RHP1 and the first high pass capacitor CHP1. The third transistor M1c senses a high-pass signal voltage at the node 616 and the source follower provides a same voltage at the node 626, which drives the second capacitor C2. The first capacitor C1 and the second capacitor C2 are coupled to node 622, which means that current flowing through the first capacitor C1 and the second capacitor C2 converges at node 622. A voltage at node 626 is a high pass version of a voltage at node 624, which is a voltage after the Miller amplifier. Thus, the current flowing through the second capacitor C2 is different from the current flowing through the first capacitor C1. For example, the current through the second capacitor C2 only includes current with high-frequency components. As a result, more high frequency components are present at node 622 through which the second capacitor C2 and the corresponding high path filtering path are coupled, achieving stronger feedback at high frequency. Thus, low impedance at a transmission (TX) jammer frequency results, which leads to a low TX jammer voltage swing at nodes 606 and 622.

A source of the third transistor M1c is coupled to a drain of the fourth transistor M1d at node 626. A power supply 612 is coupled to a drain of the third transistor M1c while a source of the fourth transistor M1d is coupled to ground 614 (or a reference potential). The buffer is coupled to the high pass filter via a gate of the third transistor M1c. For example, the gate of the third transistor M1c is coupled to the node 616 between the first high pass capacitor CHP1 and the first resistor RHP1. The third transistor M1c is biased based on a bias voltage VB provided at a node 618 of the high pass filter. The high pass filter and buffer are configured such that a frequency dependent capacitor (e.g., the second capacitor C2) can be implemented in the N-path filter 600. As the frequency increases, the impedance of the second capacitor C2 decreases, which cause sharper filtering.

The first transistor M1a and the second transistor M1b may operate as a mixer to down-convert or up-convert a signal received by the N-path filter 600. To operate as a mixer, a gate of each of the first transistor M1a and the second transistor M1b are coupled to a same LO (or different LOs) to operate at a same or different LO frequency. The first transistor M1a and the second transistor M1b may be driven by a same local oscillator (LO) phase and frequency. For example, the N-path filter 600 may be operating at a phase of zero (0) degrees, such that the first transistor M1a and the second transistor M1b are in phase (e.g., at a phase of zero (0) degrees) with each other. However, the first transistor M1a and the second transistor M1b may be driven by different LO frequencies. For example, the first transistor M1a and the second transistor M1b may be driven by different LO frequencies to cause the transistors to operate at different frequencies to achieve down-conversion or upconversion of a radio frequency or baseband signal received by the N-path filter. Whether the upconversion occurs in the first transistor M1a or the second transistor M1b depends on the signal received at the node 606.

For example, nodes 622 and 624 may include or may be characterized by baseband voltages, while nodes 606 and 628 include or are characterized by radio frequency signals. At an in-band frequency that is close to DC, the impedance associated with the first capacitor C1 and the second capacitor C2 is large. In this case, a received signal (which is close to DC) cannot pass through the first capacitor C1 and the second capacitor C2 and therefore there is little or no feedback (e.g., the high impedance acts like an open circuit). Accordingly, the first transistor M1a down-converts the signal received at the node 606 (local oscillator frequency plus a low frequency which is close to DC) such that the signal at the node 622 is a down-converted version of the signal at the node 606. However, in the presence of an out of band frequency (e.g., transmitter (TX) jammer frequency including a local oscillator frequency plus a high frequency (e.g., 100 MHz)), the impedances of the first capacitor C1 and the second capacitor C2 are small and thus the feedback gets stronger. In this case, the signal flows through node 628 to node 624 (down-conversion), to the first capacitor C1 and second capacitor C2, to node 622 and then to node 606 (upconversion). The signal at node 606 feeds the Miller amplifier (feedback loop).

Aspects of the present disclosure use Miller effect to achieve high impedance (e.g., capacitance) with a reduced impedance (e.g., a reduced sized capacitor) rather than a large impedance (e.g., a large capacitor). The Miller effect accounts for an increase in an equivalent input impedance (e.g., capacitance) of an inverting voltage amplifier due to amplification of the effect of impedance between the input and output terminals. For example, a Miller amplifier is configured to amplify a Miller capacitance formed at an input node of the Miller amplifier.

The Miller amplifier 620 is included in the N-path filter 600 to reduce the filter bandwidth without increasing the value of the capacitors. The Miller amplifier 620 increases loop gain associated with the N-path filter 600. In one aspect, the Miller amplifier applies amplification (e.g., gain of −4) to create more voltage swing across the first capacitor C1 and/or across the second capacitor C2. For example, the capacitors (C1 and/or C2) experience one volt (positive) and four volts (negative) for a total of five volts across the capacitors C1 and/or C2. Thus, when one volt is applied at the node 606, the node 628 swings four volts consistent with the Miller effect. As a result, the current flowing through the capacitors C1 and/or C2 is five times more than a conventional implementation because the voltage across the capacitor(s) is five times larger. Thus, more capacitance is seen from Vin without adding a large capacitor because more current flows through the capacitor(s).

In one aspect, one or more notches are established in the feedback path (e.g., the first feedback path and/or the second feedback path) based on the capacitor(s) (e.g., C1) to form a bandpass filter. At the higher frequency, more capacitance is provided, which causes the frequency response curve to be sharper and creates a sharper filter, as illustrated in FIG. 5B. The sharpening of the frequency response occurs as a result of applying Miller effect to the second capacitor C2 while creating high-order filtering. The value of the capacitor C1 depends on $R_S$, which is the series resistance of the Thévenin equivalent circuit 602 and a desired bandwidth. For example, if the desired bandwidth is ten (10) MHz and the series resistance $R_S$ is one hundred (100) ohms, the capacitance C1 is eight (8) pF with Miller amplification of −4. The value of the capacitor C2 depends on a high pass filter zero frequency of the high pass filtering path, the series resistance $R_S$ and the desired bandwidth. For example, the capacitance of the capacitor C2 can be fifteen (15) pico farad for a zero at 5.3 MHz.

In this aspect illustrated in FIG. 6, the high pass filtering path includes a filter with one zero. The high pass filtering path is used in conjunction with a lowpass filter to form a bandpass filter. A high pass filter feedback is provided to the first feedback path to create a sharper frequency response. For example, the high pass filter feedback is provided to the second capacitor C2, which is only visible at the higher frequency.

Figure 7:
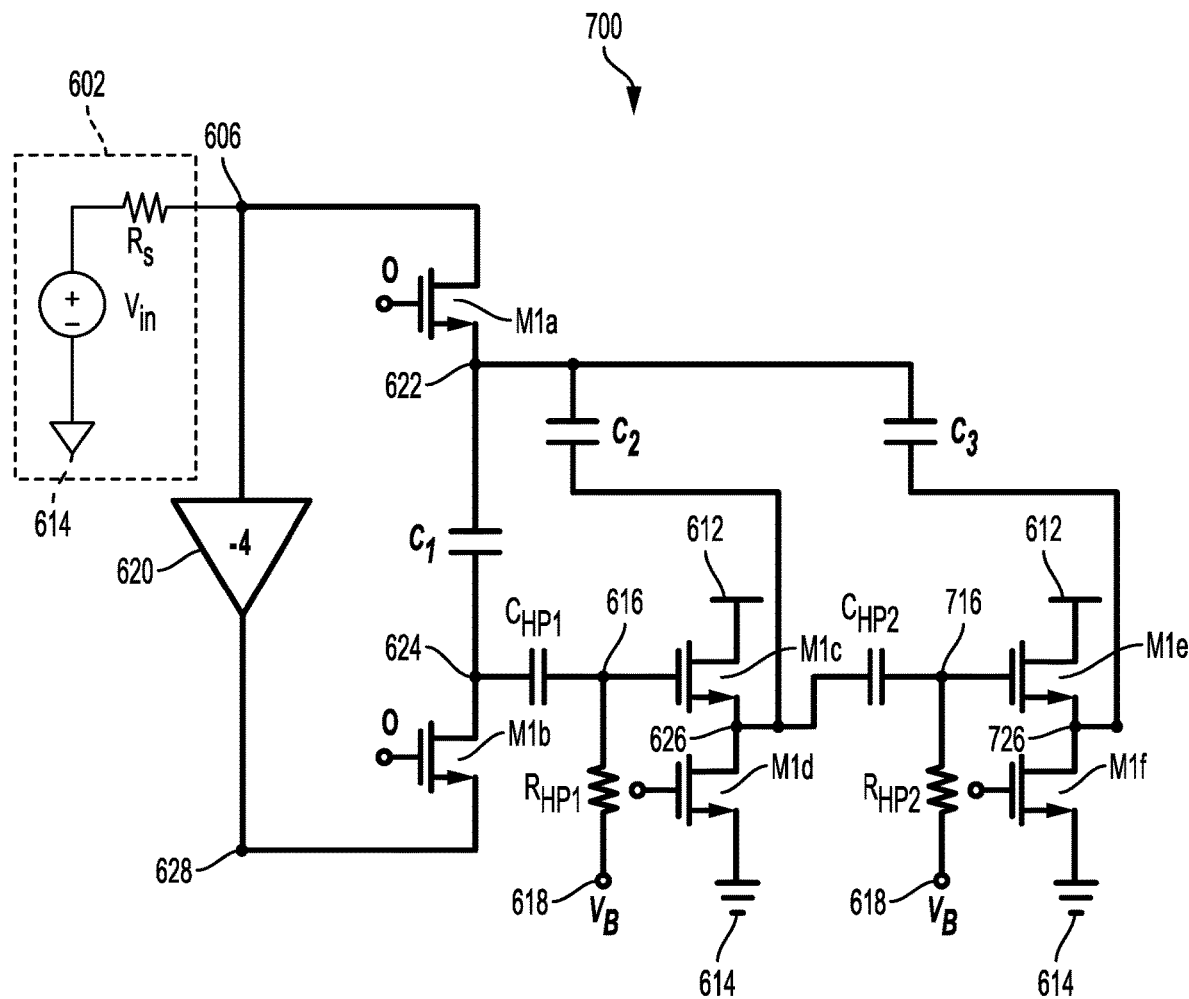
FIG. 7 illustrates an N-path filter including two high pass filtering paths according to aspects of the present disclosure.

FIG. 7 illustrates an N-path filter 700 including two high pass filtering paths according to aspects of the present disclosure. For illustrative purposes, only a single branch of the N-path filter 700 is shown. The N-path filter 700, however, may include multiple branches operating in accordance with different phases (e.g., zero degrees, ninety degrees, one hundred and eighty degrees, two hundred and seventy degrees, etc.)

For illustrative purposes, some of the labelling and numbering of the devices and features of FIG. 7 are similar to those of FIG. 6. In addition to the features of FIG. 6, FIG. 7 includes another high pass filtering path (or third feedback path). The third feedback path includes a third capacitor C3 in series with a second buffer and a second high pass filter. The second buffer includes a fifth transistor M1e and a sixth transistor M1f. The second high pass filter includes a second high pass capacitor CHP2 and a second resistor RHP2.

A terminal of the third capacitor C3 is coupled to a same node 622 as a terminal of the second capacitor C2. Another terminal of the third capacitor C3 is coupled to a node 726, which is common to the transistors M1e and M1f. For example, a source of the fifth transistor M1e and a drain of the sixth transistor M1f are coupled to each other via the node 726. The high pass filter is coupled between the gate of the fifth transistor M1e and the node 626. For example, a node 716 between the second high pass capacitor CHP2 and the second resistor RHP2 is also coupled to the gate of the fifth transistor M1e.

Similar to the second capacitor C2, the third capacitor C3 is a frequency dependent capacitor. However, the third capacitor C3 is only visible at a frequency that is higher than a frequency at which the second capacitor C2 is visible. The additional high pass filtering path introduces another zero (for a total of two zeros), which allows the path through the third capacitor C3 to provide more out-of-band rejection as illustrated in FIG. 8.

Figure 8:
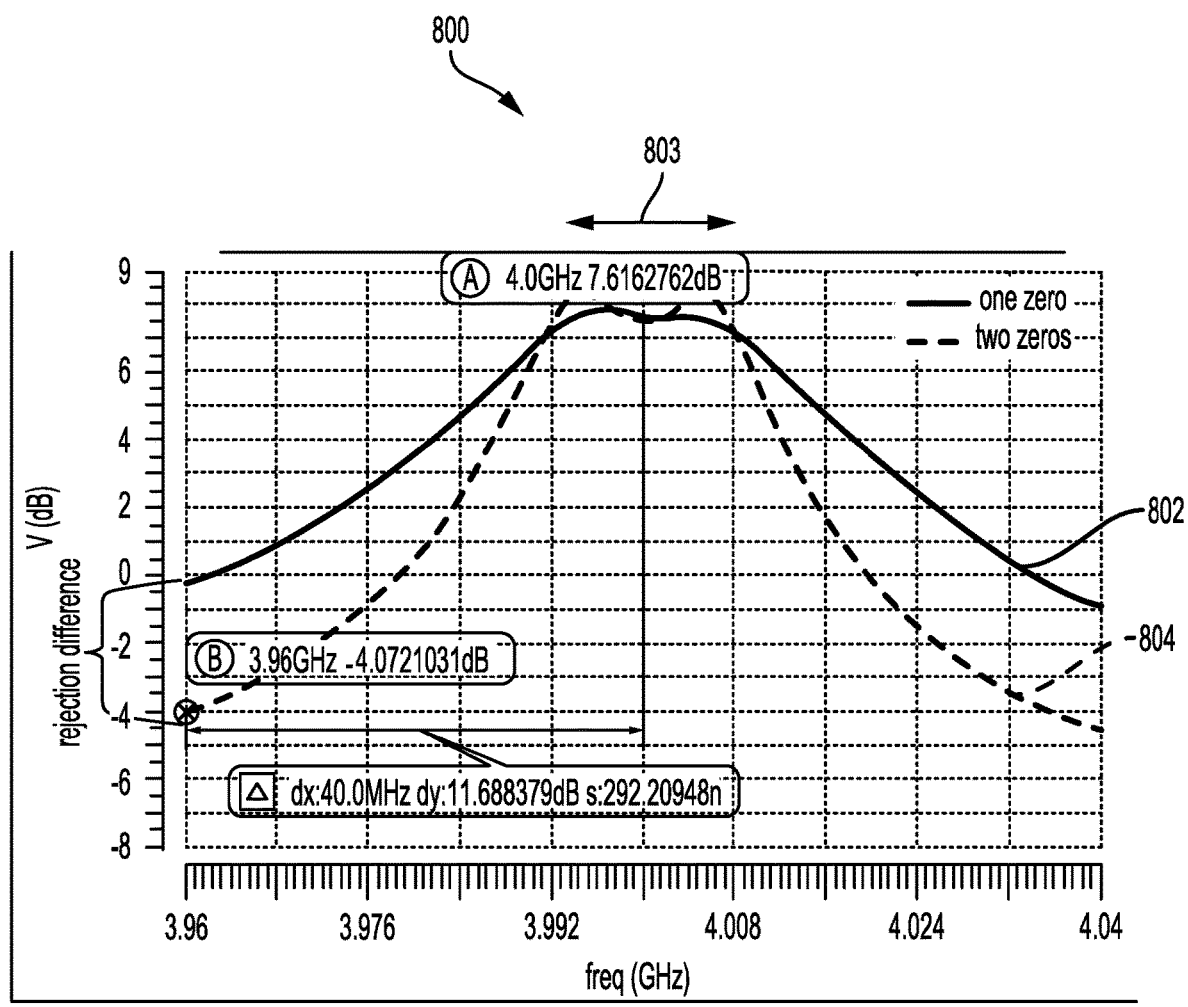
FIG. 8 is a graph showing a first frequency response of a lower order bandpass filter and a second frequency response of a higher order bandpass filter.

FIG. 8 is a graph 800 showing a first frequency response 802 of a lower order bandpass filter and a second frequency response 804 of a higher order bandpass filter. For example, the lower order bandpass filter may correspond to the N-path filter 600 of FIG. 6 with a single zero associated with the high pass filtering path. The higher order bandpass filter may correspond to the N-path filter 700 of FIG. 7 with two zeros associated with the high pass filtering path. A radio frequency bandwidth 803 of both filters is the same. For example, both the lower bandpass filter and the higher bandpass filter, in this case, have a same radio frequency bandwidth 803 (e.g., twenty megahertz (MHz)). For an offset of forty megahertz (40 MHz), the higher order bandpass filter achieves four decibels (4 dB) more rejection than the lower order bandpass filter.

Figure 9:
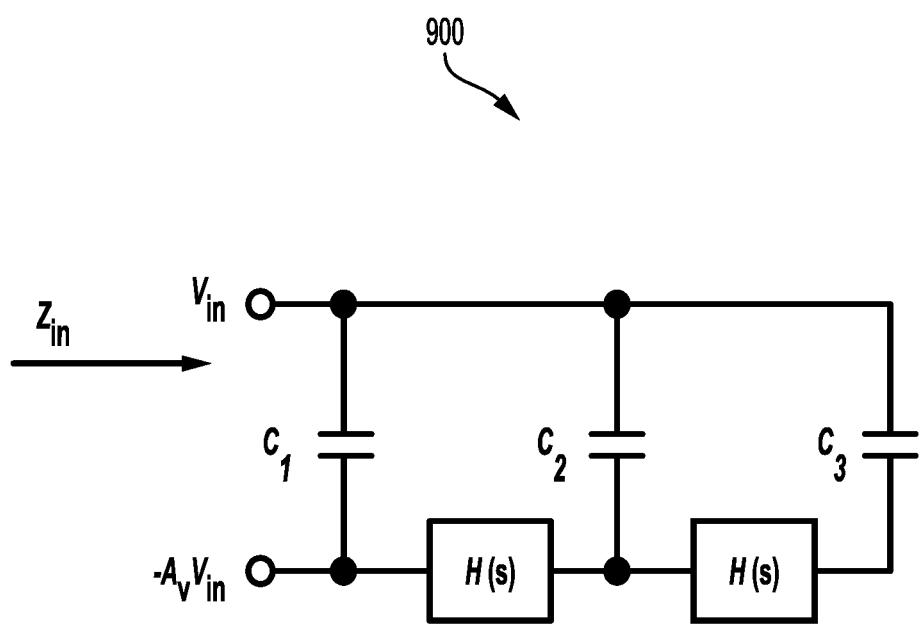
FIG. 9 represents a Thévenin equivalent circuit of the N-path filter of FIG. 7 including two high pass filtering paths according to aspects of the present disclosure.

FIG. 9 represents a Thévenin equivalent circuit 900 of the N-path filter 700 including two high pass filtering paths according to aspects of the present disclosure. The Thévenin equivalent circuit 900 illustrates a baseband equivalent model of the N-path filter 700 as seen from an antenna represented by the Thévenin equivalent circuit 602. The first high pass filtering path and the second high pass filtering path have transfer functions in an S domain represented by H(s). An s-plane is a complex plane on which Laplace transforms are graphed. It is a mathematical domain where, instead of viewing processes in the time domain modelled with time-based functions, they are viewed as equations in the frequency domain. For example, the transfer function H(s) may be represented by the following equation:

$$H(s) = \frac{0.8 \cdot S}{S + 1/(R_B C_B)}$$

where S is a complex frequency parameter for Laplace transforms, $R_B$ represents a high pass resistor (e.g., the first resistor RHP1 or the second resistor RHP2), and CB represents a high pass capacitor (e.g., the first high pass capacitor CHP1 or the second high pass capacitor CHP2).

The gain of the N-path filter 700 may be calculated as follows:

$$\frac{V_1(s)}{V_{in}(s)} = \frac{1 + 4 \cdot R_{SW} \cdot s[(1 + A_V)C_1 + (1 + A_V H(s))C_2 + (1 + A_V H^2(s))C_3]}{1 + 4 \cdot (R_S + R_{SW}) \cdot s[(1 + A_V)C_1 + (1 + A_V H(s))C_2 + (1 + A_V H^2(s))C_3]}$$

where Vi(s) is an output voltage of the N-path filter 700, $R_{SW}$ is a switch resistance of a branch switch (e.g., the branch resistance of the transistors M1a), $R_S$ is the series resistance of the Thévenin equivalent circuit 602, and $A_V$ is a gain of the Miller amplifier. It is to be noted that as the series resistance $R_S$ becomes larger, the transmit rejection improves.

Figure 10:
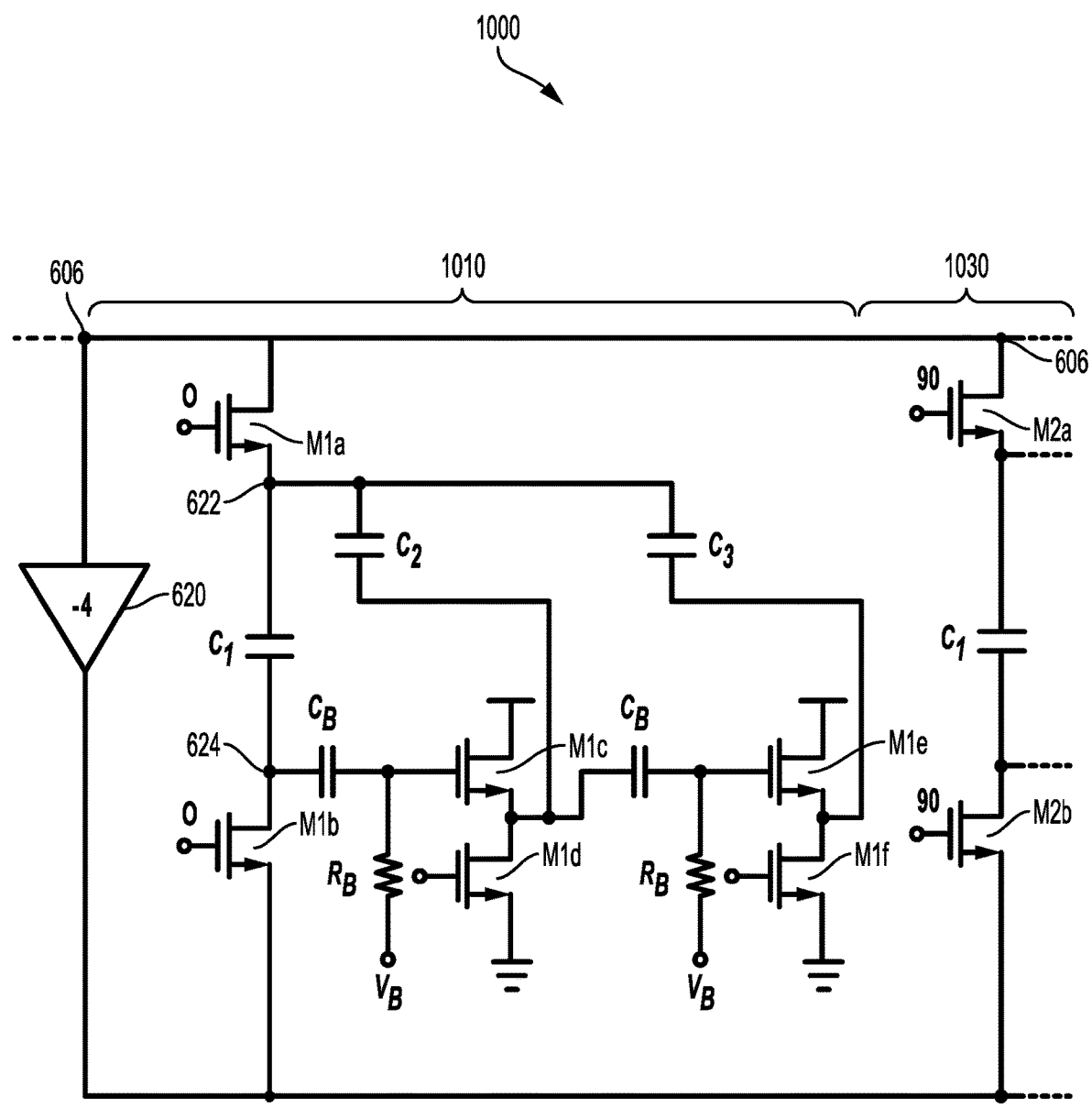
FIG. 10 illustrates an N-path filter with multiple branches, with each branch including two high pass filtering paths.

FIG. 10 illustrates an N-path filter 1000 with multiple branches, with each branch including two high pass filtering paths. For illustrative purposes, some of the labelling and numbering of the devices and features of FIG. 10 are similar to those of FIG. 7. However, instead of a single branch as shown in FIG. 7, the N-path filter 1000 includes multiple branches. For example, the multiple branches may include a first branch 1010 and a second branch 1030. Each of the first branch 1010 and the second branch 1030 are similar to the single branch shown in FIG. 7. However, for illustrative purposes, only a portion of the second branch 1030 is shown. For example, the second branch 1030 shows transistors M2a and M2b and the first capacitor C1. The first branch 1010 may operate in accordance with a first phase (e.g., zero degrees) and the second branch 1030 may operate in accordance with a second phase (e.g., ninety degrees).

In this aspect, the first terminal of the first capacitor C1 is coupled to both the node 606 (associated with the input voltage) and the input of the radio frequency Miller amplifier 620 via the first transistor or switch M1a. A second terminal of the first capacitor C1 is coupled to the output of the radio frequency Miller amplifier 620 via the second transistor M1b. The first transistor M1a and the second transistor M1b are configured as mixers to up-convert or down-convert a radio frequency signal through the N-path filter 1000.

A local oscillator (not shown) is coupled to a gate of the first transistor M1a and to a gate of the second transistor M1b to configure each of the transistors to operate as a mixer. The first branch 1010 and the second branch 1030 are selectively coupled to a shared circuit node (e.g., node 606) that receives the input voltage Vin. In this aspect, however, the Miller amplifier 620 is selectively shared across the first branch 1010 and the second branch 1030. Thus, only one Miller amplifier supports both branches.

Figure 11:
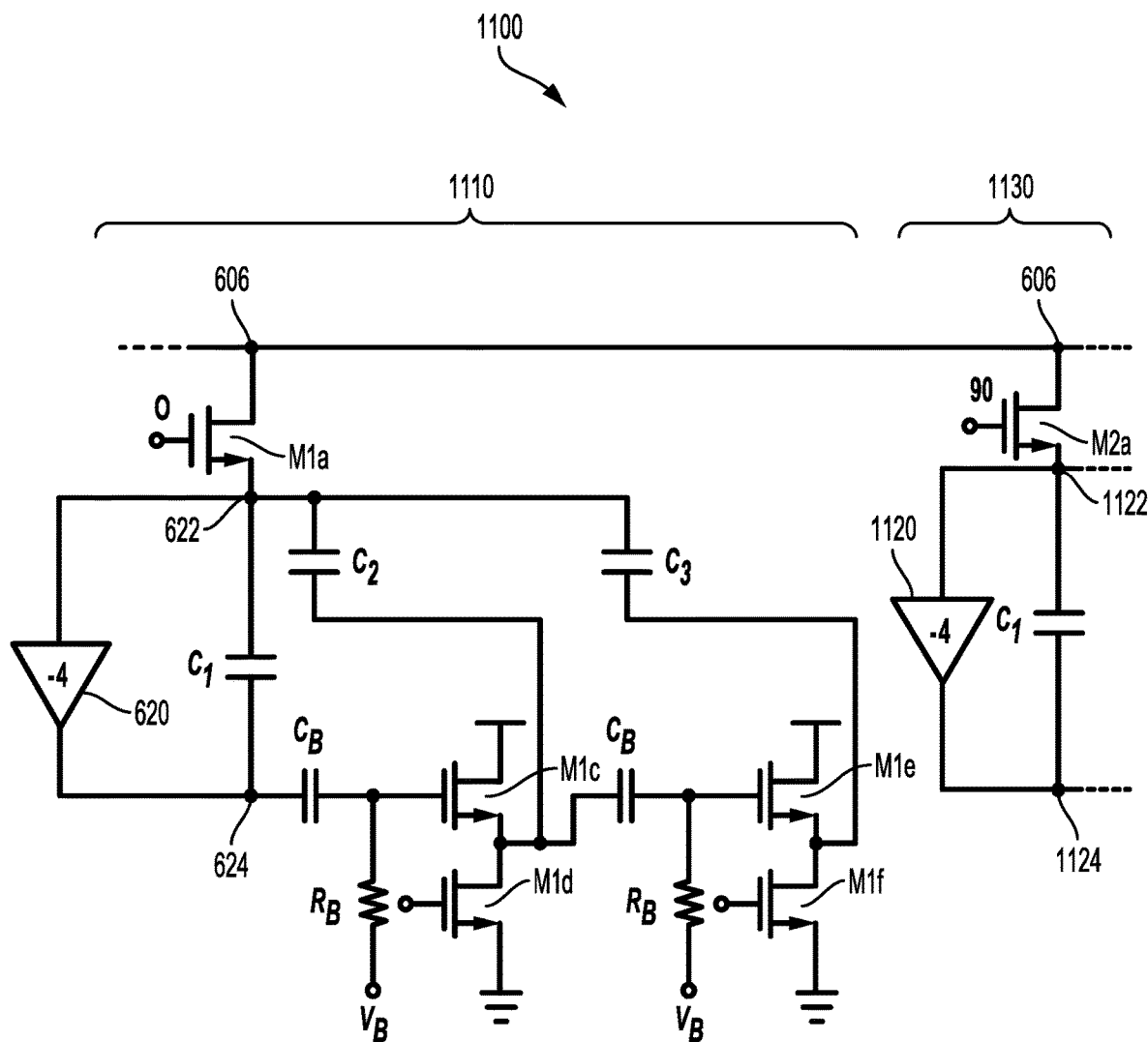
FIG. 11 illustrates an N-path filter with multiple branches, with each branch including two high pass filtering paths.

FIG. 11 illustrates an N-path filter 1100 with multiple branches, with each branch including two high pass filtering paths. For illustrative purposes, some of the labelling and numbering of the devices and features of FIG. 11 are similar to those of FIG. 7.

Instead of a single branch as shown in FIG. 7, the N-path filter 1100 includes multiple branches. Additionally, FIG. 11 uses a baseband Miller amplifier for baseband amplification instead of the radio frequency amplifier of FIG. 7 for radio frequency amplification. For example, the multiple branches may include a first branch 1110 and a second branch 1130. Each of the first branch 1110 and the second branch 1130 is similar to the single branch shown in FIG. 7. The first terminal of the Miller amplifier 620 is coupled or connected to the node 622 at a source of the transistor M1a and the first terminal of the first capacitor C1 of the first branch 1110. The second terminal of the Miller amplifier 620 is coupled or connected to the node 624 at the second terminal of the first capacitor C1 of the first branch 1110. However, an out of band signal (e.g., a TX jammer) after the Miller amplifier 620, does not see a mixer (e.g., transistor M1a).

For illustrative purposes, only a portion of the second branch 1130 is shown. For example, the second branch 1130 shows the transistor M2a (without a transistor M2b) and the first capacitor C1. Similar to the first branch 1110, a first terminal of a Miller amplifier 1120 of the second branch 1130 is coupled or connected to a node 1122 at a source of the transistor M2a and a first terminal of the first capacitor C1 of the second branch 1130. A second terminal of the Miller amplifier 1120 is coupled or connected to a node 1124 at a second terminal of the first capacitor C1 of the second branch 1130. The first branch 1110 may operate in accordance with a first phase (e.g., zero degrees) and the second branch 1130 may operate in accordance with a second phase (e.g., ninety degrees).

The first terminal of the first capacitor C1 of the first branch 1110 is coupled to the node 606 (associated with the input voltage Vin) via the first transistor or switch M1a. A second terminal of the first capacitor C1 is coupled to the output of the radio frequency Miller amplifier 620.

The first transistor M1a is configured as mixer. A local oscillator (not shown) is coupled to the gate of the first transistor M1a to configure the transistor to operate as a mixer. The first branch 1110 and the second branch 1130 are selectively coupled to a shared circuit node (e.g., node 606) associated with the input voltage Vin. In this aspect, however, the Miller amplifier 620 and the Miller amplifier 1120 are respectively allocated to the first branch 1110 and the second branch 1130. Thus, a Miller amplifier is allocated for each of the branches. Although not show, it is also contemplated that Miller amplifiers are provided as shown in FIG. 11 and also as shown in FIGS. 6 and 7. In this case, the Miller amplifiers are selectively engaged, depending on which mode is selected.

Figure 12:
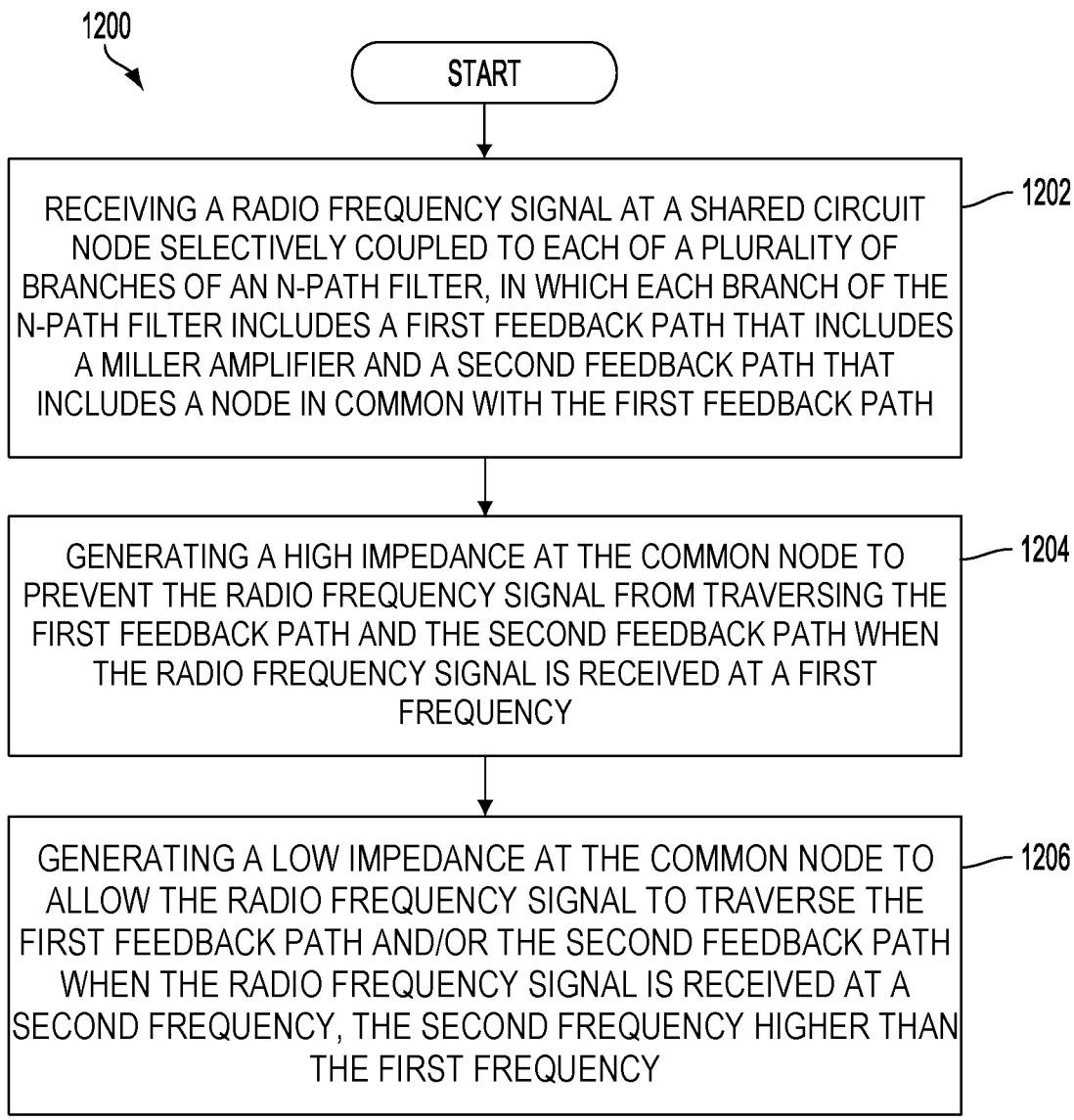
FIG. 12 depicts a simplified flowchart of a method for filtering jammer signals according to aspects of the present disclosure.

FIG. 12 depicts a simplified flowchart of a method 1200 for filtering a wireless signal at a receiver (e.g., of a user equipment). At block 1202, a radio frequency signal is received at a shared circuit node selectively coupled to each of multiple branches of an N-path filter. Each branch of the N-path filter includes a first feedback path including a Miller amplifier and a second feedback path having a node in common with the first feedback path. At block 1204, a high impedance is generated at the common node to prevent the radio frequency signal from traversing the first feedback path and the second feedback path when the radio frequency signal is received at a first frequency. At block 1206, a low impedance at the common node is generated to allow the radio frequency signal to traverse the first feedback path and/or the second feedback path when the radio frequency signal is received at a second frequency, the second frequency higher than the first frequency.

According to one aspect of the present disclosure, an N-path filter is described. The filter includes first, second and third means for generating impedance. The first impedance generating means may, for example, be the first capacitor C1. The second impedance generating means may, for example, be the second capacitor C2. The third impedance generating means may, for example, be the third capacitor C3. In another aspect, the aforementioned means may be any module or any apparatus or material configured to perform the functions recited by the aforementioned means.

FIG. 13 is a block diagram showing an exemplary wireless communication system in which a configuration of the disclosure may be advantageously employed. For purposes of illustration, FIG. 13 shows three remote units 1320, 1330, and 1350 and two base stations 1340. It will be recognized that wireless communication systems may have many more remote units and base stations. Remote units 1320, 1330, and 1350 include IC devices 1325A, 1325B, and 1325C that include the disclosed N-path filter. It will be recognized that other devices may also include the disclosed N-path filter, such as the base stations, switching devices, and network equipment. FIG. 13 shows forward link signals 1380 from the base station 1340 to the remote units 1320, 1330, and 1350 and reverse link signals 1390 from the remote units 1320, 1330, and 1350 to base station 1340.

In FIG. 13, remote unit 1320 is shown as a mobile telephone, remote unit 1330 is shown as a portable computer, and remote unit 1350 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 13 illustrates remote units according to the aspects of the disclosure, the disclosure is not limited to these exemplary illustrated units. Aspects of the disclosure may be suitably employed in many devices, which include the N-path filter.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A N-path filter, comprising:
a first branch comprising:
a first feedback path comprising:
an amplifier having an input coupled to an input voltage, and
a first capacitor coupled to both the input voltage and an output of the amplifier; and
a second feedback path having a node in common with the first feedback path, the second feedback path comprising:
a first high pass filter coupled to the output of the amplifier;
a second capacitor coupled to both the first capacitor and the first high pass filter; and
a buffer coupled to an output of the first high pass filter and to the second capacitor, the buffer comprising a biased source follower device.

2. The N-path filter of claim 1, further comprising:
a third feedback path comprising:
a second high pass filter coupled to an output of the first high pass filter, and
a third capacitor coupled to both the first capacitor and the second capacitor and to the second high pass filter.

3. The N-path filter of claim 2, wherein the buffer is coupled to an input of the second high pass filter.

4. The N-path filter of claim 1, integrated into a receive (RX) chain before or after a low noise amplifier (LNA) in accordance with a shunt configuration.

5. The N-path filter of claim 1, in which the amplifier comprises a Miller amplifier or an amplifier based at least in part on Miller effect.

6. The N-path filter of claim 5, in which the Miller amplifier comprises a radio frequency Miller amplifier and in which,
a first terminal of the first capacitor is coupled to both the input voltage and the input of the Miller amplifier via a first switch; and
a second terminal of the first capacitor is coupled to the output of the Miller amplifier via a second switch.

7. The N-path filter of claim 5, in which the Miller amplifier comprises a baseband Miller amplifier and in which,
a first terminal of the first capacitor is coupled to a first terminal of a first switch and the input of the Miller amplifier; and
a second terminal of the first capacitor is coupled to the output of the Miller amplifier, a second terminal of the first switch coupled to the input voltage.

8. The N-path filter of claim 1, further comprising, a second branch, in which the first branch and the second branch are selectively coupled to a shared circuit node that receives the input voltage, in which the first branch and the second branch are respectively operated in accordance with a first phase and a different second phase, and in which the amplifier is selectively shared by the first branch and the second branch.

9. The N-path filter of claim 1, further comprising a second branch, in which the first branch and the second branch are selectively coupled to a shared circuit node that receives the input voltage, in which the first branch and the second branch are respectively operated in accordance with a first phase and a different second phase, and in which the amplifier is allocated to the first branch and another amplifier is allocated to the second branch.

10. A N-path filter, comprising:
a first branch comprising:
a first feedback path comprising:
an amplifier having an input coupled to an input voltage, and
first means for generating an impedance, the first impedance generating means coupled to both the input voltage and an output of the amplifier; and
a second feedback path having a node in common with the first feedback path, the second feedback path comprising:
a first high pass filter coupled to the output of the amplifier;
second means for generating an impedance, the second impedance generating means coupled to both the first impedance generating means and the first high pass filter; and
a buffer coupled to an output of the first high pass filter and to the second impedance generating means, the buffer comprising a biased source follower device.

11. The N-path filter of claim 10, further comprising:
a third feedback path comprising:
a second high pass filter coupled to an output of the first high pass filter, and
third means for generating an impedance, the third impedance generating means coupled to both the first impedance generating means and the second impedance generating means and to the second high pass filter.

12. The N-path filter of claim 11, further comprising a second buffer coupled to an output of the second first high pass filter and to the third impedance generating means.

13. The N-path filter of claim 10, integrated into a receive (RX) chain before or after a low noise amplifier (LNA) in accordance with a shunt configuration.

14. The N-path filter of claim 10, in which the amplifier comprises a Miller amplifier or an amplifier based at least in part on Miller effect.

15. A N-path filter coupled to an RF signal path, the N-path filter comprising:
a first branch comprising:
a first feedback path comprising:
an amplifier having an input coupled to an input voltage, and
a first capacitor coupled to both the input voltage and an output of the amplifier; and
a second feedback path having a node in common with the first feedback path, the second feedback path comprising:
a first high pass filter coupled to the output of the amplifier; and
a second capacitor coupled to both the first capacitor and the first high pass filter,
wherein the common node is characterized by baseband voltages.

16. The N-path filter of claim 15, further comprising a buffer coupled to an output of the first high pass filter and to the second capacitor.

17. The N-path filter of claim 16, in which the buffer comprises a biased source follower device.

18. The N-path filter of claim 15, further comprising:
a third feedback path comprising:
a second high pass filter coupled to an output of the first high pass filter, and
a third capacitor coupled to both the first capacitor and the second capacitor and to the second high pass filter.

19. The N-path filter of claim 18, further comprising a buffer coupled to an output of the first high pass filter and to the second capacitor, the buffer further coupled to an input of the second high pass filter.

* * * * *